(12) United States Patent
Meir et al.

(10) Patent No.: US 9,111,648 B2
(45) Date of Patent: Aug. 18, 2015

(54) REDUNDANCY SCHEMES FOR NON-VOLATILE MEMORY BASED ON PHYSICAL MEMORY LAYOUT

(75) Inventors: Avraham Poza Meir, Rishon Le-Zion (IL); Alexander (Sasha) Paley, Kfar-Saba (IL)

(73) Assignee: Apple Inc., Cupertino, CA (US)

( * ) Notice: Subject to any disclaimer, the term of this patent is extended or adjusted under 35 U.S.C. 154(b) by 288 days.

(21) Appl. No.: 13/596,629

(22) Filed: Aug. 28, 2012

(65) Prior Publication Data

US 2014/0068142 A1    Mar. 6, 2014

(51) Int. Cl.
| | |
|---|---|
| *G06F 11/20* | (2006.01) |
| *G11C 29/00* | (2006.01) |
| *G06F 11/10* | (2006.01) |
| *G06F 3/06* | (2006.01) |
| *G06F 12/02* | (2006.01) |

(52) U.S. Cl.
CPC .............. *G11C 29/82* (2013.01); *G11C 29/804* (2013.01); *G06F 3/0679* (2013.01); *G06F 11/1008* (2013.01); *G06F 11/1012* (2013.01); *G06F 11/1028* (2013.01); *G06F 11/1068* (2013.01); *G06F 12/0246* (2013.01); *G06F 2212/1032* (2013.01)

(58) Field of Classification Search
CPC .............. G06F 3/0679; G06F 12/0246; G06F 2212/7208; G06F 2212/1032; G06F 11/1008; G06F 11/1028; G06F 11/1044; G06F 11/1068; G06F 11/108; G06F 11/1612; G06F 11/1666; G06F 11/2056

USPC ......................................................... 711/103
See application file for complete search history.

(56) References Cited

U.S. PATENT DOCUMENTS

| | | | |
|---|---|---|---|
| 2003/0115514 A1* | 6/2003 | Ilkbahar et al. | 714/52 |
| 2009/0172335 A1 | 7/2009 | Kulkarni et al. | |
| 2011/0066793 A1* | 3/2011 | Burd | 711/103 |
| 2011/0072189 A1 | 3/2011 | Post et al. | |
| 2011/0302477 A1* | 12/2011 | Goss et al. | 714/773 |
| 2012/0131270 A1 | 5/2012 | Hemmi | |

FOREIGN PATENT DOCUMENTS

EP    1 617 438    1/2006

* cited by examiner

*Primary Examiner* — Charles Rones
*Assistant Examiner* — Andrew Russell
(74) *Attorney, Agent, or Firm* — Meyertons, Hood, Kivlin, Kowert & Goetzel, P.C.

(57) ABSTRACT

A method includes, for a memory die including at least first and second memory planes, each including multiple physical memory blocks, holding a definition of a redundancy mapping between first memory blocks in the first memory plane and respective second memory blocks in the second memory plane, such that a physical separation on the die between each first physical memory block and a corresponding second physical memory block meets a predefined criterion. Data is stored in one or more first physical memory blocks in the first memory plane. Redundancy information is stored relating to the data in one or more second physical memory blocks in the second memory plane that are mapped by the redundancy mapping to the one or more first physical memory blocks.

12 Claims, 4 Drawing Sheets

REDUNDANCY SCHEMES FOR NON-VOLATILE MEMORY BASED ON PHYSICAL MEMORY LAYOUT

FIELD OF THE INVENTION

The present invention relates generally to data storage, and particularly to schemes for protecting data in memory devices.

BACKGROUND OF THE INVENTION

Various methods for protecting data in non-volatile memory are known in the art. For example, U.S. Patent Application Publication 2009/0172335, whose disclosure is incorporated herein by reference, describes multiple Flash storage devices that are configured to form a single storage device that is flexible and scalable. European Patent Application EP1617438, whose disclosure is incorporated herein by reference, describes a redundancy-based NAND Flash memory.

U.S. Patent Application Publication 2011/0066793, whose disclosure is incorporated herein by reference, describes techniques for implementing fault-tolerant data storage using Redundant Array of Inexpensive Disks (RAID) in solid state memory. U.S. Patent Application Publication 2011/0072189, whose disclosure is incorporated herein by reference, describes systems and methods for storing data to or reading data from a non-volatile memory ("NVM"), such as Flash memory, using a metadata redundancy scheme.

SUMMARY OF THE INVENTION

An embodiment that is described herein provides a method including, for a memory die including at least first and second memory planes, each including multiple physical memory blocks, holding a definition of a redundancy mapping between first memory blocks in the first memory plane and respective second memory blocks in the second memory plane, such that a physical separation on the die between each first physical memory block and a corresponding second physical memory block meets a predefined criterion. Data is stored in one or more first physical memory blocks in the first memory plane. Redundancy information is stored relating to the data in one or more second physical memory blocks in the second memory plane that are mapped by the redundancy mapping to the one or more first physical memory blocks.

In some embodiments, the redundancy mapping is derived from a layout specification of the die that indicates respective physical locations of the physical memory blocks on the die. In other embodiments, the predefined criterion specifies a minimum for the physical separation between each first physical memory block and the corresponding second physical memory block. In yet other embodiments, storing the redundancy information includes storing a duplicate copy of the data.

There is additionally provided, in accordance with an embodiment that is described herein, apparatus including a memory interface and a processor. The memory interface communicates with a memory die, which includes at least first and second memory planes, each including multiple physical memory blocks. The processor is configured to hold a definition of a redundancy mapping between first memory blocks in the first memory plane and respective second memory blocks in the second memory plane, such that a physical separation on the die between each first physical memory block and a corresponding second physical memory block meets a predefined criterion, to store data in one or more first physical memory blocks in the first memory plane, and to store redundancy information relating to the data in one or more second physical memory blocks in the second memory plane that are mapped by the redundancy mapping to the one or more first physical memory blocks.

There is additionally provided, in accordance with an embodiment that is described herein, apparatus including a memory die and a processor. The memory die includes at least first and second memory planes, each including multiple physical memory blocks. The processor is configured to hold a definition of a redundancy mapping between first memory blocks in the first memory plane and respective second memory blocks in the second memory plane, such that a physical separation on the die between each first physical memory block and a corresponding second physical memory block meets a predefined criterion, to store data in one or more first physical memory blocks in the first memory plane, and to store redundancy information relating to the data in one or more second physical memory blocks in the second memory plane that are mapped by the redundancy mapping to the one or more first physical memory blocks.

There is additionally provided, in accordance with an embodiment that is described herein, a method including for a memory die that includes at least first and second memory planes, each including multiple physical memory blocks, obtaining a layout specification of the die indicating respective physical locations of physical memory blocks on the die. Based on the layout specification, a redundancy mapping is defined between first memory blocks in the first memory plane and respective second memory blocks in the second memory plane, such that a physical separation on the die between each first physical memory block and a corresponding second physical memory block meets a predefined criterion. A memory controller is configured with the redundancy mapping, so as to cause the memory controller to store data in one or more first physical memory blocks in the first memory plane and to store redundancy information relating to the data in one or more second physical memory blocks in the second memory plane that are mapped by the redundancy mapping to the one or more first physical memory blocks.

The present invention will be more fully understood from the following detailed description of the embodiments thereof, taken together with the drawings in which:

DETAILED DESCRIPTION OF EMBODIMENTS

Overview

Figure 1:
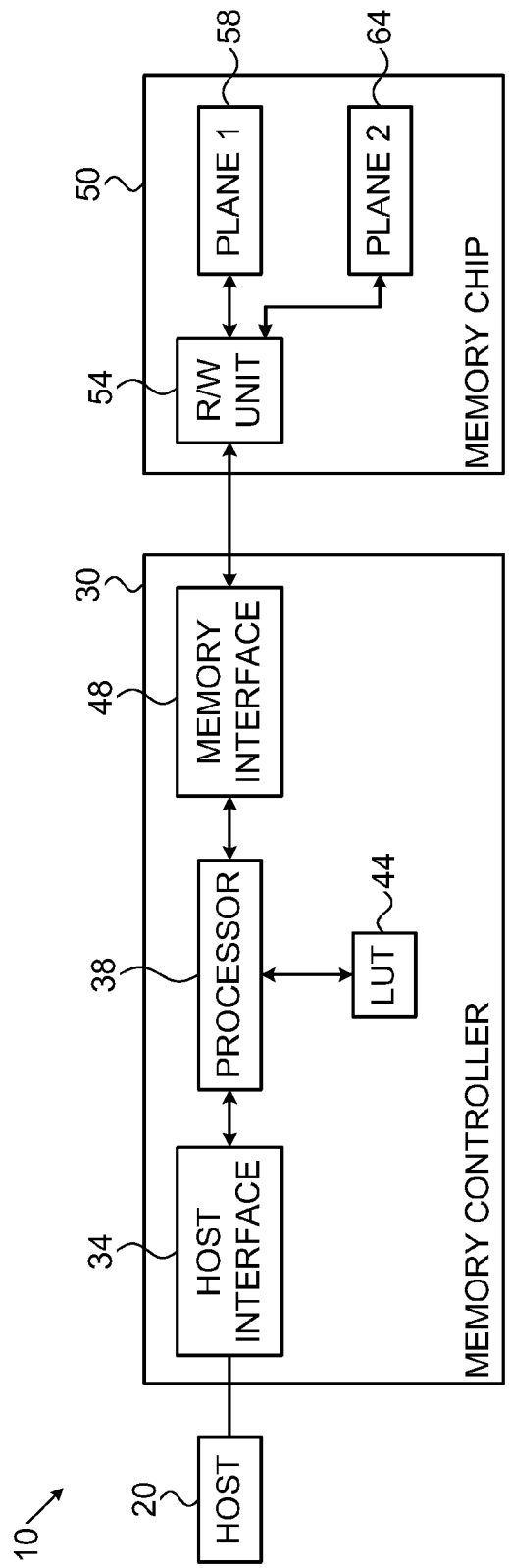
FIG. 1 is a block diagram that schematically illustrates a non-volatile memory system, in accordance with an embodiment of the present invention.

A non-volatile memory system typically comprises a memory controller and one or more memory devices. Each memory device comprises one or more semiconductor memory dies. Each memory die typically comprises multiple memory planes, each comprising multiple physical memory blocks. The physical memory blocks are sometimes referred to herein as blocks for brevity. Each block comprises an array of memory cells.

Non-volatile memory dies, such as Flash dies, are susceptible to semiconductor crystal defect mechanisms and other defect mechanisms. Such defects can result in damaged memory cells over small portions of the die. In some scenarios, a defect may span multiple blocks. Defects in a die may be formed during production or later, during the die operational lifetime. Data written into memory cells, which are damaged by such defect mechanisms, is typically lost.

Embodiments of the present invention that are described herein provide improved methods and systems for preventing data loss due to die defects. In some embodiments, when the memory controller stores data in a certain physical memory block belonging to a first plane, it also stores redundancy information relating to this data in another physical memory block in a second plane of the same die. The redundancy information may comprise, for example, a duplicated copy of the data. If the data is corrupted due to a defect, the memory controller may reconstruct it using the redundancy information. Storing the data and redundancy information in different planes provides a certain degree of protection against defects, since a single defect is unlikely to span both planes.

Nevertheless, the above solution still leaves some probability that a given defect will affect both planes, in which case it may corrupt both the data and its redundancy information. In order to reduce this probability, in the disclosed embodiments the memory controller uses a predefined mapping that maps blocks in the first plane to respective blocks in the second plane. The mapping is defined such that the physical separation on the die between two blocks that are mapped to one another (one in each plane) meets a predefined criterion. The memory controller stores the data in a first block, and the corresponding redundancy information in a second block that is mapped to the first block.

The mapping is typically derived from physical layout information of the die, which is obtained from the die manufacturer. The physical layout information gives, for example, the physical locations on the die of each memory block. The layout information can be used, for example, to maximize the physical distances between blocks that are mapped to one another. Maximizing the physical separation between mapped blocks reduces the probability that a single defect will corrupt both the data and its redundancy information.

The disclosed redundancy schemes are particularly useful in applications where the number of dies is small, such as single-die applications. In such applications, it is often impossible or very costly in terms of performance to implement redundancy across multiple dies. The disclosed techniques can be used with various kinds of redundancy information, such as mirroring, XOR or Error Correction Coding (ECC).

System Description

FIG. 1 is a block diagram that schematically illustrates a non-volatile memory system 10, in accordance with an embodiment of the present invention. System 10 can be used in various host systems and devices, such as in computing devices, cellular phones and smartphones, other communication terminals, removable memory modules (sometimes referred to as "USB Flash Drives"), Solid State Drives (SSD), digital cameras, music and other media players and/or any other system or device in which data is stored and retrieved.

In system 20, a host 20 communicates with a memory controller 30. The memory controller stores data for the host in a memory device (memory chip) 50. The memory controller comprises a host interface 34 for communicating with the host, a memory interface 48 for communicating with the memory chip, and a processor 38 that carries out the methods described herein. In particular, processor 38 stores a redundancy mapping based on the physical layout of memory chip 50 to be described later in a lookup table (LUT) 44.

Memory chip 50 comprises a read/write (R/W) unit 54, which is configured to read and write data to two memory planes 58 and 64 and also denoted Plane 1 and Plane 2, respectively. The configuration of two memory planes in the memory chip is purely for conceptual clarity and not be way of limitation of the embodiments of the present invention.

Each of planes 58 and 64 comprises multiple physical memory blocks, each comprising a respective array of non-volatile memory cells. In the present example the memory cells comprise Flash cells. The memory cells store data as analog voltages and may comprise analog cells of any kind, such as, for example, NAND, NOR and Charge Trap Flash (CTF) cells, phase change RAM (PRAM, also referred to phase change memory—PCM), Nitride Read Only Memory (NROM), Ferroelectric RAM (FRAM), magnetic RAM (MRAM) and/or Dynamic RAM (DRAM) cells.

Each physical memory block typically comprises on the order of $10^6$ memory cells. Each plane typically comprises $10^3$ blocks. A memory chip, or die, whose terms are used interchangeably, typically comprises two or more planes of memory cells.

The configuration of FIG. 1 is an exemplary system configuration, which is shown purely for the sake of conceptual clarity. Any other suitable memory system configuration can also be used. Elements that are not necessary for understanding the principles of the present invention, such as various interfaces, addressing circuits, timing and sequencing circuits and debugging circuits, have been omitted from the figure for clarity.

Memory controller 30, and in particular processor 38, may be implemented in hardware. Alternatively, the memory controller may comprise a microprocessor that runs suitable software, or a combination of hardware and software elements. Memory die 50 typically comprises a semiconductor substrate on which R/W unit 54 and memory planes 58 and 64 are fabricated.

Although the example of FIG. 1 shows a single memory die 50, system 10 may comprise multiple memory dies that are controlled by memory controller 30. In the exemplary system configuration shown in FIG. 1, memory die 50 and memory controller 30 are implemented as two separate Integrated Circuits (ICs). In alternative embodiments, however, the memory die and the memory controller may be integrated on separate semiconductor dies in a single Multi-Chip Package (MCP) or System on Chip (SoC), and may be interconnected by an internal bus. Further alternatively, some or all of the memory controller circuitry may reside on the same die on which the memory planes are disposed. Further alternatively, some or all of the functionality of memory controller 30 can be implemented in software and carried out by a processor or other element of host 20. In some embodiments, host 20 and memory controller 30 may be fabricated on the same die, or on separate dies in the same device package.

In some embodiments, processor 38 of memory controller 30 comprises a general-purpose processor, which is programmed in software to carry out the functions described herein. The software may be downloaded to the processor in electronic form, over a network, for example, or it may, alternatively or additionally, be provided and/or stored on non-transitory tangible media, such as magnetic, optical, or electronic memory.

Redundancy Mapping Based on Physical Memory Layout

Regions, or zones, of age dependent, or stress induced defects on the memory chip can damage the data written to physical blocks in the memory. The damage zone may result, for example, from air trapped in the semiconductor layers of the memory die during manufacturing. Typically these small regions of defects are localized, such that a defect zone spanning two adjacent planes may damage both the data and the redundancy information, if the data in a physical block in the first plane and the redundancy data in a physical block in the second plane are both within the defect zone.

Figure 2A:
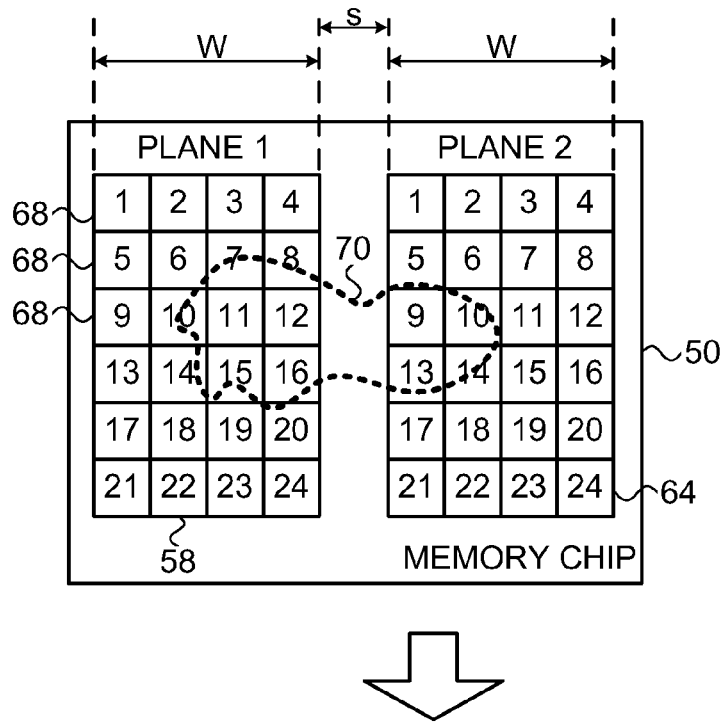
FIGS. 2A and 2B are diagrams that schematically illustrate a redundancy storage scheme based on physical memory layout, in accordance with an embodiment of the present invention.
Figure 2B:
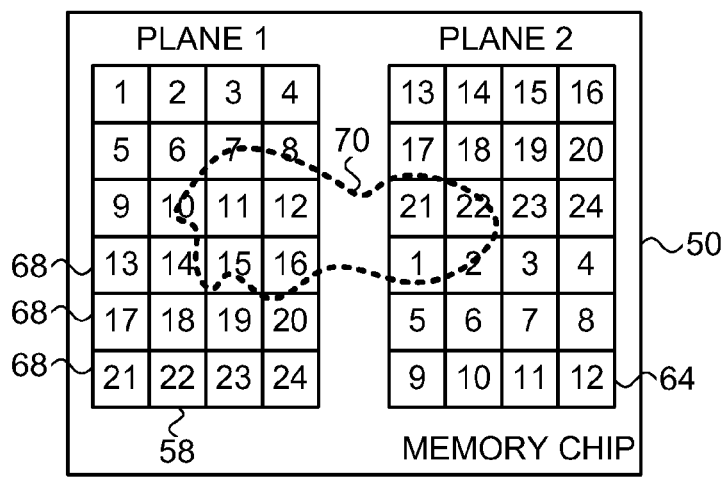

FIGS. 2A and 2B are diagrams that schematically illustrate a redundancy storage scheme based on physical memory layout, in accordance with an embodiment of the present invention. FIG. 2A shows a possible conventional configuration for comparison, whereas FIG. 2B shows an improved mapping in accordance with an embodiment of the present invention.

As can be seen in the figures, planes 58 and 64 are divided into physical memory blocks 68. The 6×4 memory block array comprising twenty-four physical memory blocks is shown here merely for conceptual clarity. In real-life memory dies, the planes typically comprise on the order of $10^3$ blocks.

The physical memory blocks in Plane 1 are marked with indices 1-24 as shown. When processor 38 writes data into a certain block 68 in Plane 1, it also writes a redundancy copy of the data into the block having the same index in Plane 2.

The configurations of FIGS. 2A and 2B differ in the way blocks 68 in the two planes are mapped to one another. Consider first FIG. 2A. In this configuration, the redundancy mapping maps the data into parallel physical blocks in Planes 1 and 2.

A defect damage zone 70 as previously described results in a failure of the memory cells within the zone. In FIG. 2A, the data stored in the blocks falling in zone (e.g., blocks 7,8,10, 11,12,14,15 and 16 of Plane 1) and the redundancy information stored in the blocks falling in zone 70 (e.g., blocks 9,10,13 and 14 of Plane 2) will be corrupted. Thus, the data stored in blocks 10 and 14 of Plane 1 is irreparably lost, since both copies of the data are within defect damage zone 70.

The redundancy mapping of FIG. 2B, on the other hand, prevents this loss of data. For the example shown here, the data denoted 1 in plane 1 is written to a physical block in the top left corner of plane 1, but the redundancy copy is written to a physical block in the center of plane 2. Similarly, the data denoted 12 is written to a physical block in the middle of plane 1, but the redundancy copy is written a physical block at the bottom right corner of plane 2. As can be seen in the FIG. 2B, defect damage zone 70 does not cover any pair of blocks that are mapped to one another. Thus, the improved mapping of FIG. 2B prevents data loss due to this defect. The redundancy mapping is typically pre-loaded to LUT 44 in memory controller 30, for use by processor 38.

In some embodiments, the redundancy mapping is based on the physical layout of the memory chip. The physical layout information is typically provided by the manufacturer of the memory chip. The redundancy mapping is derived based on the layout and dimensions of the die, so as to meet predefined criteria. Redundancy mapping rules for keeping either the physical block in Plane 1, or the corresponding physical block for a redundancy data copy in Plane 2, outside of defect zone 70 are uploaded to LUT 44 in memory controller 30. Memory controller 30 then writes the data to a physical block in Plane 1 and to a respective physical block in Plane 2 in accordance with the layout-based redundancy mapping.

The predefined criterion for the specific mapping rule shown here is that the distance between the first physical block in plane 1 and the redundancy copy in second physical block in plane 2 should be separated by a distance of at least W+S, where W is the plane width and S is the spacing between planes as shown in the FIG. 2A. For defect damage zone 70 which cuts the same physical blocks as in FIG. 2A, there is no loss of data shown in FIG. 2B, as opposed to FIG. 2A, due to the redundancy mapping. At least one copy of the data remains undamaged.

Figure 3A:
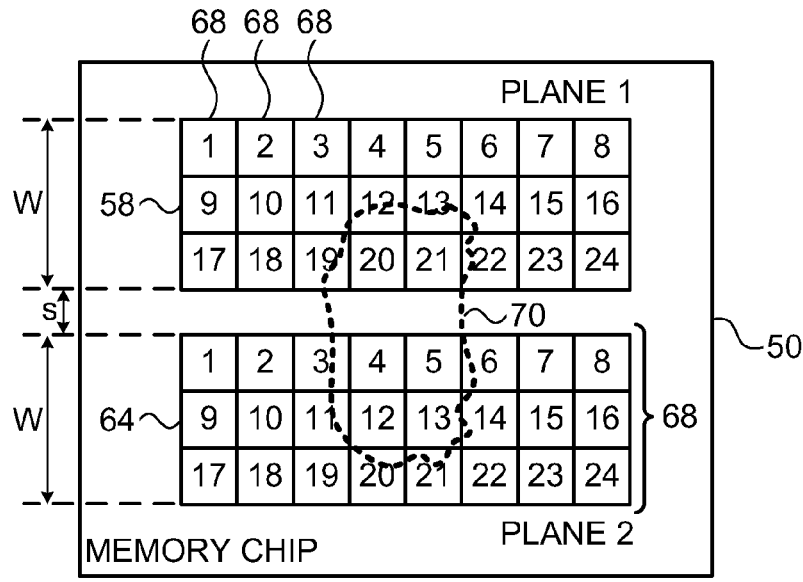
FIGS. 3A and 3B are diagrams that schematically illustrate a redundancy storage scheme based on physical memory layout, in accordance with an alternative embodiment of the present invention.
Figure 3B:
Figure 3B:
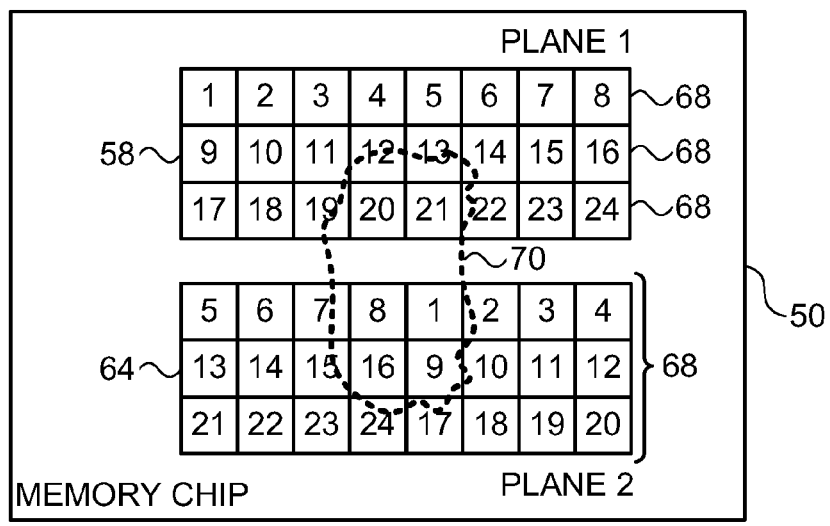

FIGS. 3A and 3B are diagrams that schematically illustrate a redundancy storage scheme based on physical memory layout, in accordance with an alternative embodiment of the present invention. Again, FIG. 3A shows a possible conventional solution for reference, and FIG. 3B shows an improved redundancy mapping in accordance with an embodiment of the present invention.

In FIGS. 3A and 3B, the twenty-four blocks are arranged in a different layout relative to FIGS. 2A and 2B. In the present example die 50 comprises two planes with 3×8 blocks. In FIG. 3A the data is written to a physical block in plane 1 and to the parallel respective physical block in plane 2. Defect damage zone 70 results in a loss of the data in blocks 12 and 13.

FIG. 3B shows a redundancy mapping that reduces the likelihood of data loss. The predefined criterion for the example redundancy mapping rule shown for FIG. 3B is the same as that shown in FIG. 2B, i.e., the distance between the first physical block in plane 1 and the redundancy copy in second physical block in plane 2 should be separated by a distance of at least W+S. However physically, the redundancy mapping is entirely different from that of FIG. 2B, since the aspect ratio of the planes are different between the 6×4 and the 3×8 cases and the width W of the planes is smaller.

The layout-based redundancy mapping rule described above where the separation between the physical blocks in the two planes should be at least W+S is purely for conceptual clarity and not by way of limitation of the embodiments. Any suitable redundancy mapping rule, either a rule computed from the layout specification, or a rule which is found empirically to prevent a data loss between the original data and the redundancy copy may be used. For example, the redundancy mapping may comprise mirroring the physical blocks in plane 1 into plane 2.

FIGS. 2B and 3B demonstrate how a different physical layout of the die leads to a different redundancy mapping. Note that although the physical die layouts of FIGS. 2B and 3B are entirely different, the logical functionality of die 50 in both cases is the same. This example shown the importance of the physical layout information, typically obtained from the die manufacturer, in defining the redundancy mapping.

Figure 4:
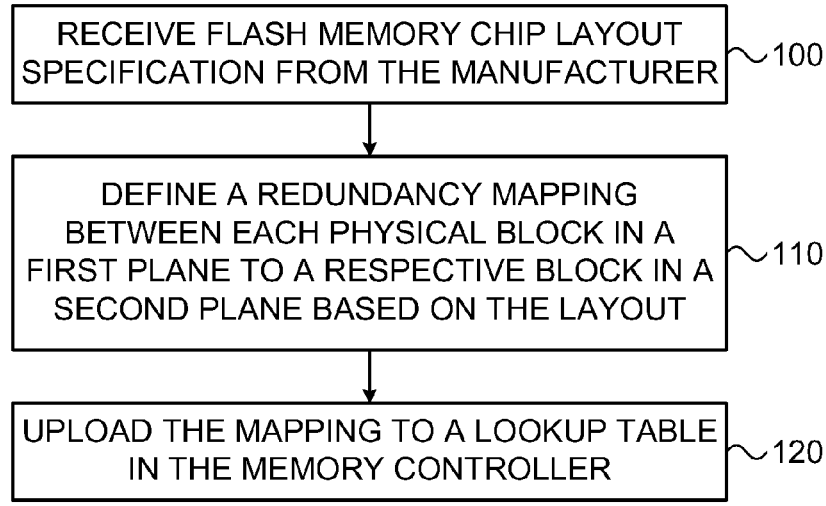
FIG. 4 is a flow chart that schematically illustrates a method for defining a redundancy mapping, in accordance with an embodiment of the present invention.

FIG. 4 is a flow chart that schematically illustrates a method for defining a redundancy mapping, in accordance with an embodiment of the present invention. In a receive step

100, a Flash memory chip layout specification is received from the chip manufacturer. In a defining step 110, a redundancy mapping between each physical block in a first plane to a respective block in a second plane is defined, based on the layout in accordance with a predefined criterion. In an upload step 120, the redundancy mapping is uploaded to a lookup table (e.g., LUT 44) in the memory controller and stored.

Figure 5:
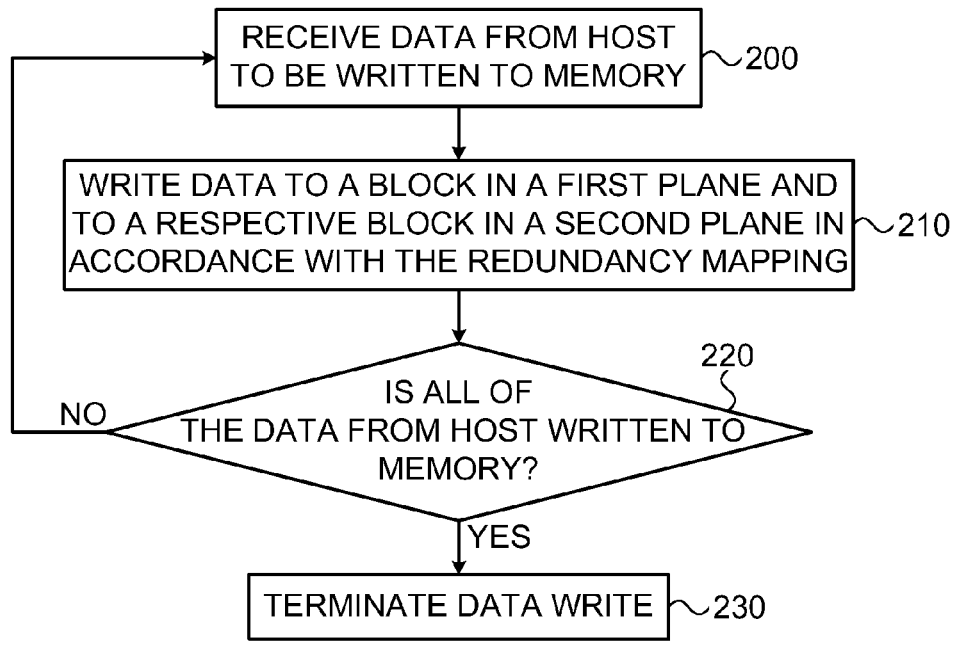
FIG. 5 is a flow chart that schematically illustrates a method for writing data to memory using a redundancy mapping, in accordance with an embodiment of the present invention.

FIG. 5 is a flow chart that schematically illustrates a method for writing data to die 50 using a redundancy mapping, in accordance with an embodiment of the present invention. In a receive step 200, processor 38 receives data from host 20 via host interface 34 to be written to memory chip 50. In a writing step 210, processor 38 writes data to a physical memory block in first plane 58 and to a respective physical memory block in second plane 64 through memory interface 48 in accordance with the redundancy mapping. In a decision step 220, memory controller 30 accesses if all of the data from host 20 was written to memory. If not, processor 38 receives the new data from the host in receive step 200. Otherwise, the data write is terminated in a termination step 230.

The embodiments described herein refer to two planes in the memory die, where the data is stored in the first plane and the redundancy data is stored in the adjacent second plane, is purely for conceptual clarity and not by way of limitation. In other embodiments, the memory die may comprise any number of planes and the methods for applying the redundancy mapping described herein may be applied to the one or more planes.

In the embodiments described herein, the redundancy information comprises a duplicate copy of the data. In alternative embodiments, any other suitable kind of redundancy can be used. For example, the redundancy data for storage in redundancy plane 64 may be computed from the logical XOR of the data in one or more of blocks 68. Error correcting codes (ECC) may also be used in computing the redundancy data. Although the embodiments described herein mainly address Flash memory, the methods described herein can also be used in other memory applications, where data loss is susceptible to defects.

It will thus be appreciated that the embodiments described above are cited by way of example, and that the present invention is not limited to what has been particularly shown and described hereinabove. Rather, the scope of the present invention includes both combinations and sub-combinations of the various features described hereinabove, as well as variations and modifications thereof which would occur to persons skilled in the art upon reading the foregoing description and which are not disclosed in the prior art. Documents incorporated by reference in the present patent application are to be considered an integral part of the application except that to the extent any terms are defined in these incorporated documents in a manner that conflicts with the definitions made explicitly or implicitly in the present specification, only the definitions in the present specification should be considered.

The invention claimed is:

1. A method, comprising:
for a memory die comprising at least first and second memory planes, each comprising multiple physical memory blocks, holding a definition of a redundancy mapping between first memory blocks in the first memory plane and respective second memory blocks in the second memory plane, such that a physical separation on the die between each first physical memory block and a corresponding second physical memory block meets a predefined criterion, wherein the redundancy mapping is derived from a layout specification of the die that indicates respective physical locations of the physical memory blocks on the die;
storing data in one or more first physical memory blocks in the first memory plane; and
storing redundancy information relating to the data in one or more second physical memory blocks in the second memory plane that are mapped by the redundancy mapping to the one or more first physical memory blocks.

2. The method according to claim 1, wherein the predefined criterion specifies a minimum for the physical separation between each first physical memory block and the corresponding second physical memory block.

3. The method according to claim 1, wherein storing the redundancy information comprises storing a duplicate copy of the data.

4. An apparatus, comprising:
a memory interface for communicating with a memory die, the memory die comprising at least first and second memory planes, each comprising multiple physical memory blocks; and
a processor, which is configured to:
hold a definition of a redundancy mapping between first memory blocks in the first memory plane and respective second memory blocks in the second memory plane, such that a physical separation on the die between each first physical memory block and a corresponding second physical memory block meets a predefined criterion, wherein the redundancy mapping is derived from a layout specification of the die that indicates respective physical locations of the physical memory blocks on the die;
store data in one or more first physical memory blocks in the first memory plane; and
store redundancy information relating to the data in one or more second physical memory blocks in the second memory plane that are mapped by the redundancy mapping to the one or more first physical memory blocks.

5. The apparatus according to claim 4, wherein the predefined criterion specifies a minimum for the physical separation between each first physical memory block and the corresponding second physical memory block.

6. The apparatus according to claim 4, wherein the processor is configured to store the redundancy information by storing a duplicate copy of the data.

7. An apparatus, comprising:
a memory die, which comprises at least first and second memory planes, each comprising multiple physical memory blocks; and
a processor, which is configured to:
hold a definition of a redundancy mapping between first memory blocks in the first memory plane and respective second memory blocks in the second memory plane, such that a physical separation on the die between each first physical memory block and a corresponding second physical memory block meets a predefined criterion, wherein the redundancy mapping is derived from a layout specification of the die that indicates respective physical locations of the physical memory blocks on the die;
store data in one or more first physical memory blocks in the first memory plane; and
store redundancy information relating to the data in one or more second physical memory blocks in the second memory plane that are mapped by the redundancy mapping to the one or more first physical memory blocks.

8. The apparatus according to claim 7, wherein the predefined criterion specifies a minimum for the physical separation between each first physical memory block and the corresponding second physical memory block.

9. The apparatus according to claim 7, wherein the processor is configured to store the redundancy information by storing a duplicate copy of the data.

10. A method, comprising:
for a memory die that comprises at least first and second memory planes, each comprising multiple physical memory blocks, obtaining a layout specification of the die indicating respective physical locations of physical memory blocks on the die;
defining, based on the layout specification, a redundancy mapping between first memory blocks in the first memory plane and respective second memory blocks in the second memory plane, such that a physical separation on the die between each first physical memory block and a corresponding second physical memory block meets a predefined criterion; and
configuring a memory controller with the redundancy mapping, so as to cause the memory controller to store data in one or more first physical memory blocks in the first memory plane and to store redundancy information relating to the data in one or more second physical memory blocks in the second memory plane that are mapped by the redundancy mapping to the one or more first physical memory blocks.

11. The method according to claim 10, wherein the predefined criterion specifies a minimum for the physical separation between each first physical memory block and the corresponding second physical memory block.

12. The method according to claim 10, wherein the redundancy information comprises a duplicate copy of the data.

* * * * *